(12) United States Patent
Meguro et al.

(10) Patent No.: US 6,458,415 B2
(45) Date of Patent: Oct. 1, 2002

(54) METHOD OF FORMING DIAMOND FILM AND FILM-FORMING APPARATUS

(75) Inventors: Kiichi Meguro; Takashi Matsuura; Takahiro Imai, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/873,620

(22) Filed: Jun. 4, 2001

(30) Foreign Application Priority Data

Jun. 7, 2000 (JP) ........................................ 2000-170739

(51) Int. Cl.⁷ ............................. C23C 16/26; H05H 1/46
(52) U.S. Cl. ...................................... 427/249.8; 427/575
(58) Field of Search ........................... 427/248.1, 249.8, 427/249.9, 249.11, 249.13, 249.14, 561, 569, 575; 118/715

(56) References Cited

U.S. PATENT DOCUMENTS

| | | | |
|---|---|---|---|
| 4,011,521 A | * | 3/1977 | Kantrowitz et al. ........ 331/94.5 |
| 4,407,705 A | * | 10/1983 | Garscadden et al. . 204/157.1 H |
| 5,108,778 A | * | 4/1992 | Suzuki et al. ................. 427/38 |
| 5,201,986 A | | 4/1993 | Ota et al. |
| 5,861,135 A | * | 1/1999 | Tanabe et al. ............... 423/446 |

FOREIGN PATENT DOCUMENTS

JP 04092890 3/1992

* cited by examiner

Primary Examiner—Timothy Meeks
Assistant Examiner—Eric B Fuller
(74) Attorney, Agent, or Firm—W. F. Fasse; W. G. Fasse

(57) ABSTRACT

A method and an apparatus form a diamond film from a microwave plasma by controlling a manufacturing condition based on a spectroscopic measurement of the plasma light emission to obtain a large area of a high-quality diamond film. In the method of forming a diamond film, a gas mixture of hydrocarbon gas and hydrogen gas is introduced into a reactor, where the gas mixture is excited by microwave energy which is also introduced into the reactor to generate a plasma, and the light emitted from the plasma is spectroscopically measured. Furthermore, a formation condition of the diamond film is controlled such that the spectrum of a carbon molecule ($C_2$) falls within a predetermined range of requirement. A carbon molecule vibration temperature is determined from the spectrum, and the formation pressure, or the gas flow rate is controlled so that the determined vibration temperature falls within a specified range, especially 2000 to 2800 K.

21 Claims, 3 Drawing Sheets

METHOD OF FORMING DIAMOND FILM AND FILM-FORMING APPARATUS

BACKGROUND OF THE INVENTION

1. Field of the Invention

The present invention relates to a method of forming a diamond film and a film-forming apparatus, and particularly, to a method of forming a diamond film and a film-forming apparatus utilizing microwave plasma.

2. Description of the Background Art

Various methods have been invented for forming diamond from vapor phase, such as a hot-filament CVD method, a microwave plasma assisted CVD method and so forth. The microwave plasma assisted CVD method is especially suitable, among others, for forming a high-purity polycrystalline diamond film and an epitaxial diamond film, whereby a high-quality diamond film can easily be obtained compared to the case with other methods. The other methods are associated with some problems that degrade the quality of the diamond film. For example, the hot-filament CVD method involves metal contamination from filament, and a plasma jet method involves metal contamination from an electrode. Moreover, in a combustion flame method, nitrogen in the air is mixed into diamond, degrading the quality of the diamond film. Thus, the microwave plasma assisted CVD method has been widely used as a method of obtaining a high-quality diamond film, and recently, developments have been propelled for obtaining a large area of high-quality diamond film.

The microwave plasma assisted CVD method has an advantage in that such a high-quality diamond film can easily be obtained, but suffers a drawback in that the resulting film is varied in its thickness and quality in a wide range of distribution, especially when compared to the case with the hot-filament CVD method. Thus, it is particularly difficult to obtain a large size of diamond film having a uniform thickness and quality by the microwave plasma assisted CVD method. Currently, there is not even a guideline for adjusting the variation as described above, and such a guideline is still being searched for. As a guideline in forming a diamond film by the microwave plasma method, it is known to use a temperature of a substrate measured using a radiation thermometer and a thermocouple within a reactor, and further spectrum analysis by plasma emission spectroscopy or the like. However, the substrate temperature measured by the radiation thermometer is essentially associated with the plasma emission, making it difficult to obtain an accurate temperature of the substrate. Furthermore, when the thermocouple is used for a temperature measurement, the temperature cannot directly be obtained unless the substrate is in direct contact with the thermocouple. Even if the direct contact was possible, such contact would cause disturbance, which affects formation of the diamond film. Whereas, when the plasma emission spectroscopy is used for diagnosing a plasma state, observation on the spot is possible without any contact, causing no disturbance to the plasma state. Thus, conventionally, the diagnosis using the plasma emission spectroscopy has been actively performed. The measurement using the plasma emission spectroscopy has been successful in certain ways, for instance, contamination by nitrogen, which significantly interferes with the formation of the diamond film, can be found instantly. However, the plasma emission spectroscopy has not yet reached the level where the quality and the deposition rate of the diamond film can be predicted.

SUMMARY OF THE INVENTION

The present invention is directed to provide a method for forming a diamond film from reaction gas excited by microwave, and particularly for forming a large size of a high-quality diamond film by controlling a manufacturing condition based on information on spectroscopic measurement of plasma emission, and to provide a film-forming apparatus for forming such a diamond film.

In the method of forming a diamond film according to the present invention, a gas mixture of hydrocarbon gas and hydrogen gas is introduced into a reactor where the gas mixture is excited by microwave which is also introduced into the reactor to generate plasma, in order to form a diamond film on a substrate. In the forming method, plasma emission is spectroscopically measured to control a formation condition of the diamond film such that the spectrum of a carbon molecule ($C_2$: hereinafter referred to as "carbon molecule") falls within a predetermined range of requirement.

The formation method of the diamond film from the microwave-excited plasma of this invention is based on a new idea in that the spectrum of the carbon molecule is strongly correlated with the quality of the diamond film and its distribution, and hence only an emission spectrum band of the carbon molecule is herein observed. Thus, a controlling method can be simplified, since the only requirement is to adjust the formation condition of the diamond film such that the spectrum of the carbon molecule is within the predetermined range, and therefore the formation condition of the diamond film can be precisely adjusted. As a result, the distribution of quality, i.e. spatial variation of quality, is suppressed, so that a large area of homogeneous and high-quality diamond film can be obtained. Any apparatus may be employed for forming the diamond film described above, in which reaction gas is excited by microwave to attain a plasma state and the diamond film is formed on a substrate by the plasma. A microwave plasma assisted CVD apparatus or another apparatus may be used.

In the method of forming a diamond film according to the present invention, the spectrum of a carbon molecule is a vibration spectrum of the carbon molecule, and a formation condition is controlled such that a vibration temperature obtained by such a spectrum falls within a predetermined range.

The inventors of the present invention spectroscopically measured the emission of microwave plasma, and found that the vibration temperature of a carbon molecule can be derived from the emission spectrum band of the carbon molecule, i.e. one of activated molecule species constituting the plasma. They also came to a new idea in that the vibration temperature is closely related to the deposition rate and quality of the diamond, and the distribution thereof. The vibration temperature of the carbon molecule can be derived using the procedure described below.

In plasma, electrons are much lighter than atomic nuclei, and hence moves much faster. This allows the movement of the electrons and that of the atomic nuclei to be precisely separated for further discussion. Such a way of discussing these movements independent of each other is a precise approximation method called Born-Oppenheimer approximation. When Born-Oppenheimer approximation is possible, the intensity $I_{ev'v''J'J''}$ of spectral lines contained in a band spectrum emitted due to the transition of a molecule between electron states can be represented by the equation (1) below.

$$I_{ev'v''J'J''} = Cf^4 q_{v'v''} S_{J'J''} \times exp[[-(hc/kT_{ex})\,T_e] + [-(hc/kT_{vib})\,G\,(v')] + [-(hc/kT_{rot})\,F\,(J')]] \quad (1)$$

wherein e is a type of electron-term transition, v is the quantum number of vibration, J is the quantum number of rotation, and an addition of ' indicates a high level whereas that of " indicates a low level. Moreover, C is a constant, f is the vibration number of the spectral lines, $q_{v'v''}$ is a Franck-Condon factor and $S_{J'J''}$ is a Honl-London factor. Furthermore, h is a Planck constant, c is the speed of light, and k is a Boltzmann constant. In addition, $T_{ex}$, $T_{vib}$ and $T_{rot}$ indicate an excitation temperature, a vibration temperature and a rotation temperature, respectively, and $T_e$, $G(v')$ and $F(J')$ indicate the term values in the electron state, in the vibration state and in the rotation state, respectively. Noting the transition between certain electron states, the equation (1) is separated by the term of the vibration temperature and that of the rotation temperature. When $q_{v'v''}$ and $S_{J'J''}$ are known and the rotation spectrum can be resolved for measurement, the vibration temperature and the rotation temperature can be obtained independently of each other. When the rotation spectrum cannot be resolved due to e.g. limitation of wavelength resolution of a spectroscope, if $q_{v'v''}$ is known, the vibration temperature $T_{vib}$ can be obtained from the intensity of a band head (J'=J"=0). Therefore, the equation (1) can be rewritten as the equation (2) below.

$$I_{v'v''}=C_1 f^4 q_{v'v''} exp[-(hc/kT_{vib}) G(v')] \quad (2)$$

wherein $C_1$ is a constant independent of f. The intensity $I_{v'v''}$ of the spectral lines and the wavelength G (v') are directly obtained by the plasma spectroscopic measurement, so that the equation (2) can further be rewritten as the equation (3) below.

$$ln [I_{v'v''}/f^4 q_{v'v''}]=C_2-(E_{v'}/kT_{vib}) \quad (3)$$

From the equation (3), ln $[I_{v'v''}/f^4 q_{v'v''}]$ is plotted with respect to $E_{v'}$, and the inclination is obtained by fitting, to further obtain the vibration temperature of the molecule. Here, $C_2$ is a constant independent of f, and $E_{v'}$ indicates vibration energy.

According to the method described above, the wavelength resolution required for the spectroscope may be at a relatively low level of 0.3 nm. Therefore, plasma can easily be estimated by an inexpensive apparatus. The vibration temperature of $C_2$ molecule obtained as described above is close to the equilibrium with gas temperature determined by the kinetic energy of other activated species gas or neutral gas in the reactor, so that it can be approximately estimated as plasma gas temperature. The gas temperature of plasma is closely related to the film deposition rate and quality of diamond, and the distribution thereof. As described above, the present invention is based on a new idea in that the film deposition rate or the quality of diamond can be estimated by the vibration temperature of the carbon molecule that can easily be obtained. The vibration temperature of the carbon molecule can readily be controlled by changing the power of inputting microwave, pressure, gas flow rate or the like.

In the method of forming a diamond film according to the present invention, a formation condition is controlled such that the vibration temperature of the carbon molecule falls within the range between 2000 and 2800 K.

By controlling the vibration temperature to be within the range described above, a high-quality diamond film can rapidly be formed. For example, if the diamond film is formed with a vibration temperature within a range between 2400 and 2700 K, a diamond film transparent from ultraviolet to infrared regions can be obtained. Moreover, if the diamond film is formed with a vibration temperature within a range between 2200 and 2800 K, a diamond film with thermal conductivity of 1000 W/mK, which is applicable to a heat sink or the like, can be obtained. If the vibration temperature is less than 2000 K, the film deposition rate is lowered, degrading crystallinity of a resulting diamond film. In addition, distribution of the quality such as crystallinity may be varied in certain locations. On the other hand, if the vibration temperature exceeds 2800 K, the film deposition rate is increased, which now makes the crystallinity of the resulting diamond incomplete while increasing the positional variation in quality.

In the method of forming a diamond film according to the present invention, at least one of microwave-inputting power, pressure in the reactor and flow rate of each reaction gas in the formation condition of the diamond film is controlled such that the spectrum falls within a predetermined range.

The formation condition as described above can easily be controlled artificially, and control of at least one such condition allows the vibration temperature to be in the predetermined range, and hence a large area of high-quality diamond film can be obtained.

Moreover, in the method of forming a diamond film according to the present invention, the vibration temperature of the carbon molecule can be obtained from a spectrum band having a difference of +1 or −1 between a high vibration level and a low vibration level.

Though no selection rule exists in $C_2$ molecule for transition between the vibration levels, the vibration temperature can precisely be obtained from the transition with a difference of ±1 between the levels, because such transition occurs with a probability higher than transition with a difference of other value between levels. However, the level difference in vibration is not necessarily ±1, and the level difference of 0 may also be used.

In the method of forming a diamond film according to the present invention, an emission spectrum band of a carbon molecule within a range between the wavelengths of 465 and 475 nm is used to obtain a vibration temperature.

The emission spectrum band of the carbon molecule in this wavelength range has a vibration level difference of +1 and has a particularly high probability of transition, so that the vibration temperature can be obtained with high precision. Furthermore, even when automatic control is employed, obvious peaks can be seen, and the ratio of the peak intensities in the above-described wavelength range may be obtained to simplify the automatic control.

The film-forming apparatus of a diamond film according to the present invention includes a reactor in which reaction gas is excited to generate plasma; a microwave generating apparatus generating microwave; a spectroscope analyzing a spectrum of light emitted from the plasma; and an arithmetic unit obtaining a vibration temperature from an emission spectrum band of a carbon molecule obtained by the spectroscope.

The arrangement described above facilitates obtainment of the vibration temperature from the emission spectrum band of the carbon molecule. Though the arithmetic unit is preferably a microcomputer into which a software is installed, it may also be a wired logic circuit. In the arithmetic operation, the peaks in the emission spectrum band of the carbon molecule correspond to certain wavelengths, and thus the vibration temperature can rapidly be obtained by taking a ratio of the peak intensities in the vicinity of such wavelengths.

The film-forming apparatus according to the present invention further includes a control unit for controlling at least one factor of microwave-inputting power, pressure within a reactor and flow rate of reaction gas, such that the vibration temperature falls within a predetermined range, based on the value of the vibration temperature obtained by the arithmetic unit.

By the above-described arrangement, a large area of a high-quality diamond film can be obtained by automatically controlling a formation condition of the diamond film. The automatic control is desirably performed such that the diamond film is formed after the vibration temperature of a carbon molecule in plasma is brought to be within the predetermined temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Examples of the present invention will now be described with reference to the drawings.

EXAMPLE 1

Figure 1:
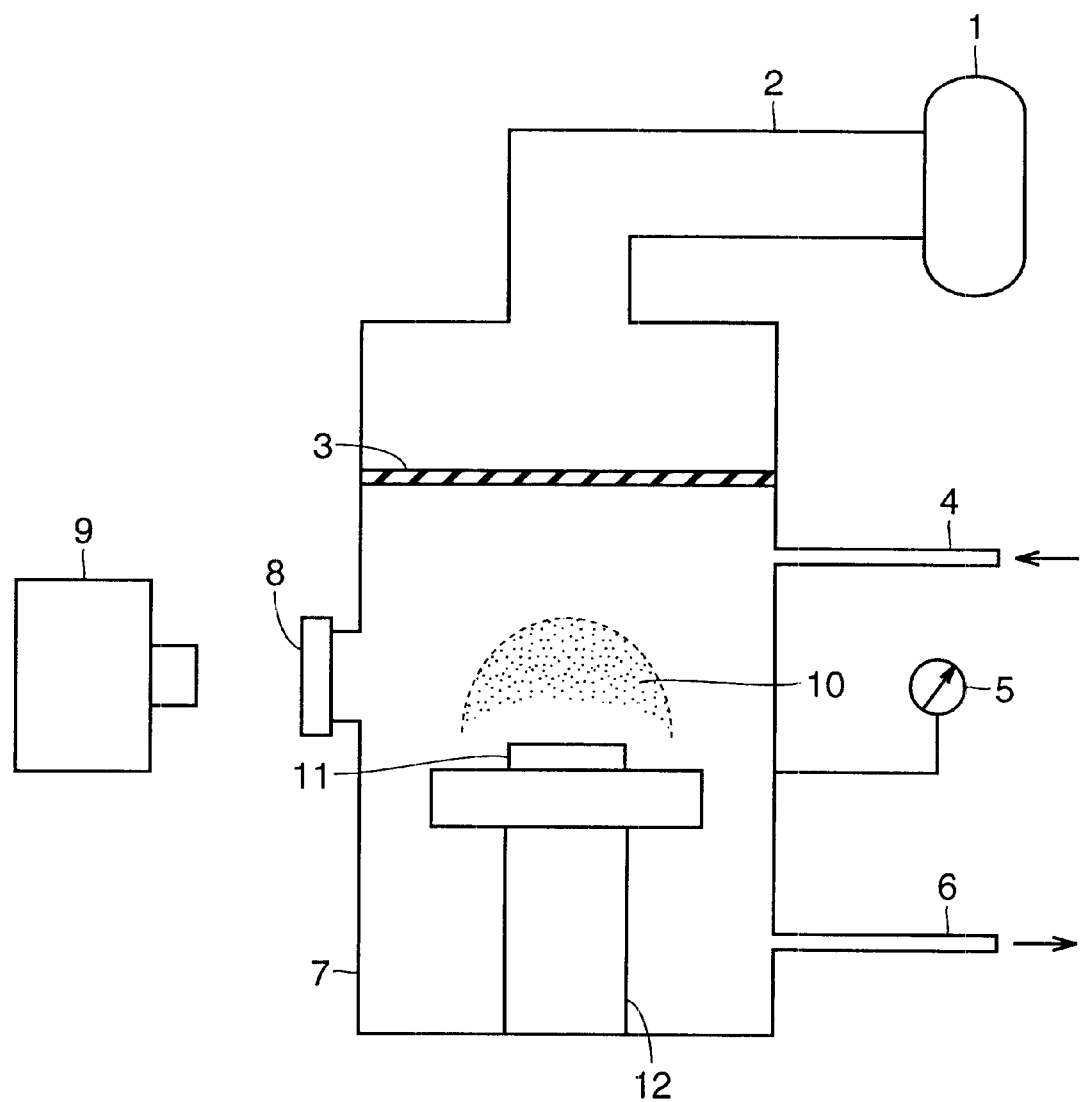
FIG. 1 shows a configuration of an apparatus for forming a diamond film according to an example of the present invention.

In the method of forming a diamond film illustrated in the present example, the diamond film is deposited on an Si substrate using a microwave plasma assisted CVD apparatus, as shown in FIG. 1. Referring to FIG. 1, reaction gas is introduced through a gas-feeding pipe 4 into a reactor 7. Microwave oscillated by a magnetron 1 is transmitted through a waveguide 2 and is introduced into reactor 7 from a quartz vacuum window 3. The microwave excites the reaction gas to generate microwave plasma 10 on Si substrate 11. The light emitted from microwave plasma 10 is transmitted through a monitoring window 8 and is spectroscopically measured by a spectroscope 9. A stage 12 on which substrate 11 is supported includes a water-cooling mechanism, and thus the temperature of the substrate can arbitrarily be controlled irrespective of the state of plasma. Formation conditions of the diamond film in the present example were as follows.

(a) Volume flow rate of hydrogen ($H_2$): 300 sccm, wherein sccm stands for standard cubic centimeter per minute.

(b) Volume flow rate of methane ($CH_4$): 3 sccm (c) Pressure in the reactor: 13.3 kPa (d) Microwave frequency: 2.45 GHz (e) Temperature of substrate: 950° C.

Figure 2:
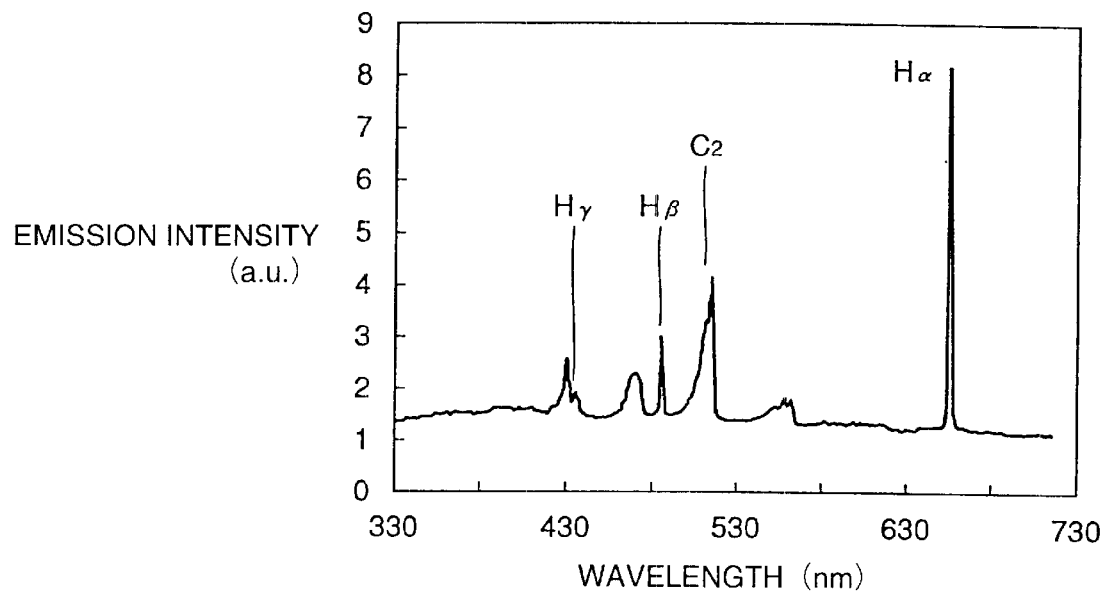
FIG. 2 shows an example of a measurement of a spectrum of plasma emission in the method of forming a diamond film according to the present invention.
Figure 3:
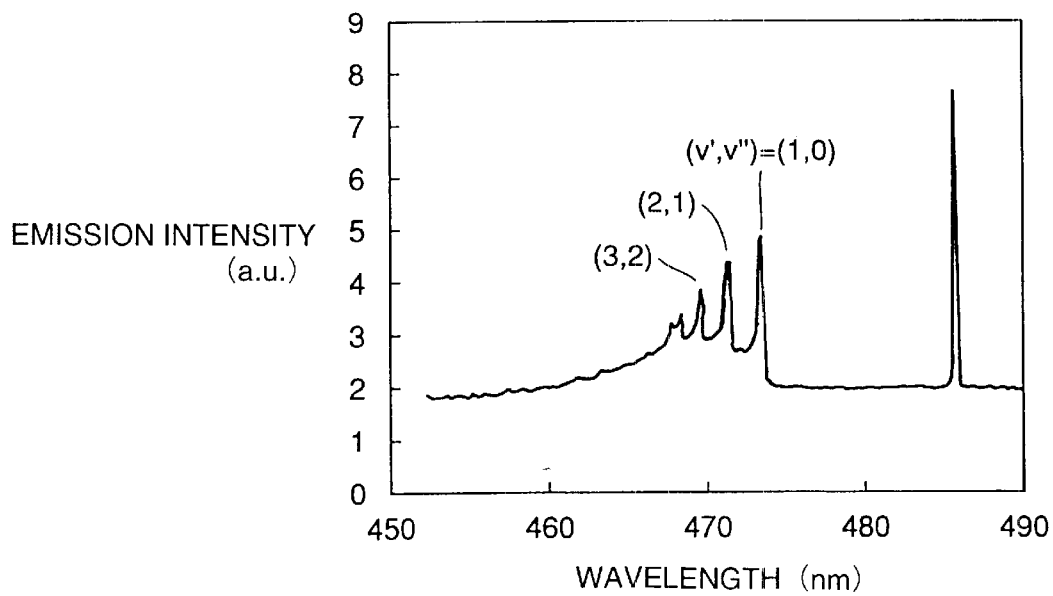
FIG. 3 is an enlarged view of a wavelength range between wavelengths of 450 and 490 nm in the example of the plasma emission measurement shown in FIG. 2.
Figure 4:
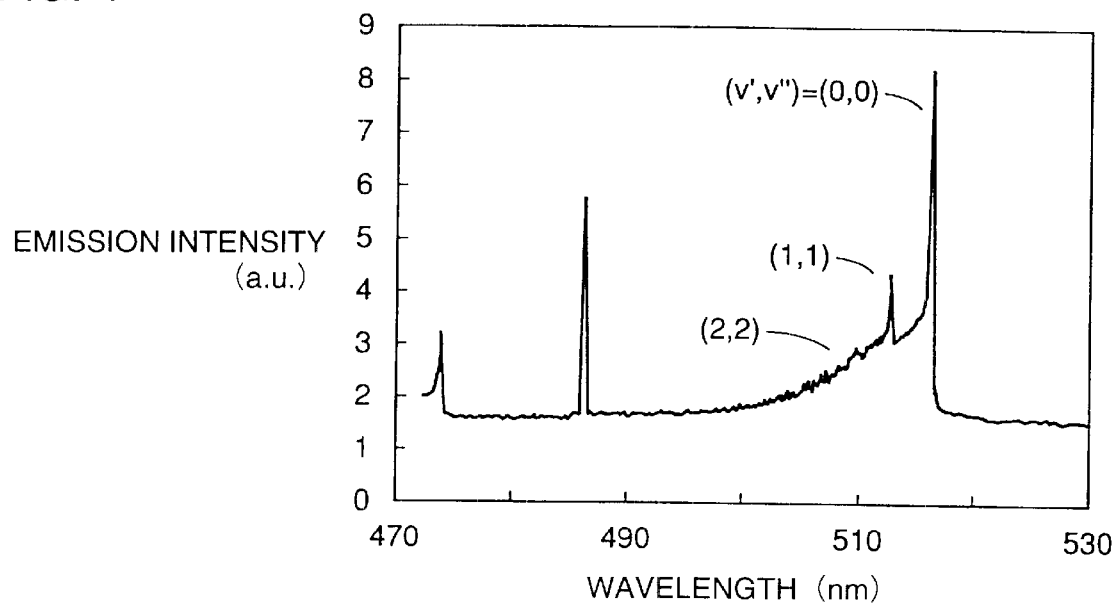
FIG. 4 is an enlarged view of a wavelength range between wavelengths of 470 and 530 nm in the example of the plasma emission measurement shown in FIG. 2.

With the conditions indicated above, the microwave-inputting power was set to be 1 kW, 3 kW and 5 kW, to form a diamond film on a Si substrate having a diameter of 2 inches. The emitted light in a visible radiation range of microwave plasma was spectroscopically measured by a spectroscope, and the result thereof is shown in FIG. 2. In the visible radiation range, the band spectrum of $C_2$ molecule was observed together with Balmer lines of an H atom. FIG. 3 shows an enlarged view of an emission band of $C_2$ molecule having a vibration level difference of +1, which is observed in the wavelength range between 465 and 475 nm. A vibration temperature can be obtained from the ratio of the peak intensities when the rotation level of the emission band of $C_2$ molecule J'=J"=0. Though the spectrum shown in FIG. 3 is used in the present example, the vibration temperature may also be obtained using the spectrum shown in FIG. 4 where the difference in the vibration levels is zero. FIG. 4 is an enlarged view of the wavelength range between 470 and 530 nm of the spectrum shown in FIG. 2. For each microwave-inputting power, (A) vibration temperature of the carbon molecule, (B) film deposition rate of diamond, and (C) full width at half maximum of diamond peak (1333 $cm^{-1}$) due to Raman spectroscopy, which is a baseline of the quality of diamond, were obtained. The obtained values are shown in Table 1 for the central and peripheral portions of the substrate.

TABLE 1

| Microwave-inputting power (kW) | Central portion of substrate | | | Peripheral portion of substrate | | |
|---|---|---|---|---|---|---|
| | Vibration temp. (K) | Deposition rate (μm/hr) | Raman FWHM ($cm^{-1}$) | Vibration temp. (K) | Deposition rate (μm/hr) | Raman FWHM ($cm^{-1}$) |
| 1 | 2200 | 1.0 | 5.5 | 1600 | 0.2 | 10.5 |
| 3 | 2700 | 1.5 | 4.5 | 2400 | 1.3 | 5.0 |
| 5 | 3000 | 1.7 | 8.5 | 2850 | 1.6 | 6.5 |

As can be seen from Table 1, the vibration temperature can be controlled by adjusting the microwave-inputting power. Moreover, it was proved that there is a close correlation between (a) vibration temperature, (b) film deposition rate of diamond and (c) Raman FWHM. Thus, when a diamond film is deposited with the vibration temperature within a range between 2400 and 2700 K, a high quality diamond film with good crystallinity having Raman FWHM of 5.0 $cm^-$ or lower can be obtained. After 100 hours of diamond deposition with the above-described microwave-inputting power of 3 kW, the Si substrate is dissolved by an acid mixture containing hydrofluoric acid and nitric acid ($HNO_3$+HF) to obtain a diamond self-supported film. The diamond film is distributed from the central portion to the peripheral portion, showing transmittance of 71%, which is close to the theoretical transmittance, from ultraviolet to infrared regions.

Though the example 1 described above used methane as a carbon source, acetylene, benzene, ethanol, or the mixture thereof may also be used to obtain a similar result.

EXAMPLE 2

In the example 2, a diamond film was deposited with the conditions indicated below using the microwave plasma assisted CVD apparatus shown in FIG. 1 that was used in the example 1. In the present example, a diamond film was formed using the conditions indicated below with constant microwave-inputting power of 3 kW and changing pressure in the reactor.

(a) Volume flow rate of hydrogen ($H_2$): 300 sccm (b) Volume flow rate of methane ($CH_4$): 3 sccm (f) Microwave-inputting power: 3 kW (d) Microwave frequency: 2.45 GHz (e) Temperature of substrate: 950° C.

With the conditions above, the pressure in the reactor was set to be at 10.7 kPa, 13.3 kPa and 16.0 kPa, to form a diamond film on an Si substrate having a diameter of 2 inches. By the method similar to that in the example 1, the vibration temperature of $C_2$ molecule was obtained for each pressure in the reactor. The pressure in the reactor, the film deposition rate (of diamond), and Raman FWHM were obtained for each of the central and peripheral portions of the substrate. The result is shown in Table 2.

As can be seen from Table 2, the vibration temperature can also be controlled by changing the pressure in the reactor. From the relation between the vibration temperature and the Raman FWHM, it is recognized that a high quality diamond film having the Raman FWHM of 5.0 cm$^{-1}$ could be formed when the vibration temperature of $C_2$ molecule was set to be within the range between 2400 and 2700 K. This diamond film is transparent from ultraviolet to infrared regions. Furthermore, it was proved that a diamond film having a thermal conductivity of 1000 W/m K or higher applicable to a heat sink or the like could be obtained if the diamond film was formed with a temperature within a range between 2200 and 2800 K.

TABLE 2

| Pressure in reactor (kPa) | Central portion of substrate | | | Peripheral portion of substrate | | |
|---|---|---|---|---|---|---|
| | Vibration temp. (K) | Deposition rate (μm/hr) | Raman FWHM (cm$^{-1}$) | Vibration temp. (K) | Deposition rate (μm/hr) | Raman FWHM (cm$^{-1}$) |
| 10.7 | 2100 | 0.9 | 6.5 | 2000 | 0.8 | 8.5 |
| 13.3 | 2700 | 1.5 | 4.5 | 2400 | 1.3 | 5.0 |
| 16.0 | 3200 | 2.2 | 11.5 | 2600 | 1.4 | 5.5 |

It is noted that the vibration temperature of a carbon molecule may be obtained in the following manner: an arithmetic unit is connected to spectroscope 9 shown in FIG. 1 and an integral of the intensity in a certain wavelength or of the intensity in the proximity including the certain wavelength is obtained. Subsequently, the arithmetic operation represented by the equation (3) is performed in the arithmetic unit, to obtain a vibration temperature of a carbon molecule.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a diamond film, wherein a gas mixture of hydrocarbon gas and hydrogen gas is introduced into a reactor, and said gas mixture is excited by microwave introduced into said reactor to generate plasma, in order to form a diamond film on a substrate, said method comprising the steps of:

spectroscopically measuring light emitted from said plasma; and controlling a formation condition of said diamond film such that a spectrum of carbon molecule ($C_2$) measured in said spectroscopic measuring step falls within a predetermined range of requirement;

wherein said formation condition is controlled such that said spectrum of the carbon molecule ($C_2$) is an emission spectrum band of the carbon molecule and that a vibration temperature is obtained from said emission spectrum band and falls within a predetermined range.

2. The method of forming a diamond film according to claim 1, wherein at least one of microwave-inputting power, pressure in a reactor and flow rate of reaction gas in said formation condition of the diamond film is controlled such that said spectrum falls within a predetermined range.

3. The method of forming a diamond film according to claim 1, wherein said formation condition is controlled such that said vibration temperature of the carbon molecule ($C_2$) falls within a range between 2000 and 2800 K.

4. The method of forming a diamond film according to claim 3, wherein said vibration temperature of the carbon molecule is obtained from a spectrum band having a difference of +1 or −1 between a high vibration level and a low vibration level.

5. The method of forming a diamond film according to claim 4, wherein said vibration temperature is obtained using said emission spectrum band of the carbon molecule ($C_2$) within a wavelength range between 465 and 475 nm.

6. The method of forming a diamond film according to claim 3, wherein at least one of microwave-inputting power, pressure in a reactor and flow rate of reaction gas in said formation condition of the diamond film is controlled such that said spectrum falls within a predetermined range.

7. The method of forming a diamond film according to claim 6, wherein said vibration temperature of the carbon molecule is obtained from a spectrum band having a difference of +1 or −1 between a high vibration level and a low vibration level.

8. The method of forming a diamond film according to claim 7, wherein said vibration temperature is obtained using said emission spectrum band of the carbon molecule ($C_2$) within a wavelength range between 465 and 475 nm.

9. A method of forming a diamond film, comprising the following steps:

a) providing a substrate in a reactor;

b) in accordance with a formation condition, introducing a gas mixture of hydrogen and a hydrocarbon gas into said reactor, and introducing microwaves into said reactor to excite said gas mixture and thereby generate a plasma which contains carbon molecules ($C_2$) and which emits light;

c) spectroscopically measuring said light emitted by said plasma so as to analyze an emission spectrum band of emissions of said carbon molecules;

d) determining from said emission spectrum band a vibration temperature of said carbon molecules;

e) specifying a predetermined temperature range and then controlling said formation condition in said step b) so that said vibration temperature determined in said step d) falls within said predetermined temperature range; and f) depositing a diamond film from said plasma onto said substrate.

10. The method according to claim 9, wherein said predetermined temperature range is in a range from 2000 K to 2800 K.

11. The method according to claim 9, wherein said predetermined temperature range is in a range from 2400 K to 2700 K, and wherein said diamond film formed in said step f) is transparent to light in a range from ultraviolet to infrared.

12. The method according to claim 9, wherein said predetermined temperature range is in a range from 2200 K to 2800 K, and wherein said diamond film formed in said step f) has a thermal conductivity of at least 1000 W/mK.

13. The method according to claim 9, wherein said formation condition comprises a microwave input power of said microwave being introduced into said reactor.

14. The method according to claim 9, wherein said formation condition comprises a gas pressure of said gas mixture in said reactor.

15. The method according to claim 9, wherein said formation condition comprises a flow rate of at least one of said hydrogen and said hydrocarbon gas of said gas mixture being introduced into said reactor.

16. The method according to claim 9, wherein said formation condition comprises a microwave input power of said microwaves being introduced into said reactor in a range from 1 kW to 5 kW, and a gas pressure of said gas mixture in said reactor in a range from 10.7 kPa to 16.0 kPa.

17. The method according to claim 9, wherein said emission spectrum band of said emissions of said carbon molecules includes a high vibration level and a low vibration level of vibration of said carbon molecules, with a vibration quantum level difference of +1 or −1 between said high vibration level and said low vibration level.

18. The method according to claim 15, wherein said determining of said vibration temperature comprises determining a ratio of peak intensities of said emissions of said carbon molecules within said emission spectrum band.

19. The method according to claim 15, wherein said determining of said vibration temperature comprises determining peak intensities of spectral peaks of said emissions at peak wavelengths within said emission spectrum band, and then evaluating an equation that relates said peak intensities at said peak wavelengths to a value of said vibration temperature.

20. The method according to claim 9, wherein said emission spectrum band is in a wavelength range of said emissions of said carbon molecules from 465 nm to 475 nm.

21. The method according to claim 20, wherein said step of spectroscopically measuring said light is limited to measuring said light in said wavelength range of said emissions of said carbon molecules from 465 nm to 475 nm.

* * * * *

UNITED STATES PATENT AND TRADEMARK OFFICE
CERTIFICATE OF CORRECTION

PATENT NO. : 6,458,415 B2
DATED : October 1, 2002
INVENTOR(S) : Meguro et al.

It is certified that error appears in the above-identified patent and that said Letters Patent is hereby corrected as shown below:

<u>Title page,</u>
Item [57], ABSTRACT,
Line 14, after "formation", insert -- condition, such as the microwave input power, the reactor --;

<u>Column 1,</u>
Line 50, after "Even if", delete "the" and insert -- such --.

Signed and Sealed this

Eighteenth Day of March, 2003

JAMES E. ROGAN
*Director of the United States Patent and Trademark Office*